(12) United States Patent
Choi

(10) Patent No.: US 6,437,427 B1
(45) Date of Patent: Aug. 20, 2002

(54) LEAD FRAME USED FOR THE FABRICATION OF SEMICONDUCTOR PACKAGES AND SEMICONDUCTOR PACKAGE FABRICATED USING THE SAME

(75) Inventor: Yeon Ho Choi, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/391,792

(22) Filed: Sep. 8, 1999

(30) Foreign Application Priority Data

Sep. 15, 1998 (KR) .............................. 98-37969

(51) Int. Cl.[7] .......................................... H01L 23/495
(52) U.S. Cl. ...................... 257/666; 257/676; 257/684; 257/696; 257/698; 257/712; 257/713; 257/706; 257/707; 257/670; 257/672; 257/675; 257/678; 257/692
(58) Field of Search ................................ 257/670, 676, 257/666, 684, 696, 712, 713, 706, 707, 671, 672, 675, 678, 698, 692

(56) References Cited

U.S. PATENT DOCUMENTS 5,723,899 A * 3/1998 Shin ........................... 257/666

FOREIGN PATENT DOCUMENTS

| JP | 59-115547 | * | 7/1984 | |
| JP | 60-210845 | * | 10/1985 | |
| JP | 6-85132 | | 3/1994 | ........... H01L/23/50 |
| JP | 7-231069 | * | 8/1995 | |

* cited by examiner

Primary Examiner—Nathan J. Flynn
Assistant Examiner—Ahmed N. Sefer

(57) ABSTRACT

A lead frame for a semiconductor package including a rectangular lead frame body having a central opening, a plurality of leads arranged at and along each of two or four facing sides of the lead frame body, the leads extending in flush with the lead frame body, and a semiconductor chip mounting plate positioned on a plane not flush with a plane, where the leads are positioned, the semiconductor chip mounting plate being supported by down-set tie bars and provided with at least one groove having a rectangular ring shape while serving to prevent a penetration of moisture and to provide an increased coupling strength for the semiconductor chip mounting plate, the semiconductor chip mounting plate also serving as a heat sink. A ground bridge bar having a rectangular ring shape is arranged between the semiconductor chip mounting plate and the leads and supported by another tie bars. By virtue of the bridge bar, the length of bonding wires is reduced, thereby eliminating the possibility of the bonding wires to be short-circuited. A lead frame having a double down-set structure is also provided. By virtue of the double down-set structure, it is possible to increase the size of the semiconductor chip mounting plate, thereby achieving an improvement in the heat discharge effect.

28 Claims, 5 Drawing Sheets

LEAD FRAME USED FOR THE FABRICATION OF SEMICONDUCTOR PACKAGES AND SEMICONDUCTOR PACKAGE FABRICATED USING THE SAME

BACKGROUND OF THE INVENTION

1. Field of the Invention

The present invention relates to a lead frame used for the fabrication of semiconductor packages and a semiconductor package fabricated using the lead frame. More particularly, the present invention relates to a lead frame for semiconductor packages, which is provided with a semiconductor chip mounting plate having a semiconductor chip mounting function and a heat discharge function.

2. Description of the Prior Art

Referring to FIG. 1, a typical structure of a lead frame for semiconductor packages is illustrated. As shown in FIG. 1, the lead frame, which is denoted by the reference numeral 1' and made of copper or an alloy thereof, is provided at each of four facing sides thereof with a plurality of leads 3 (in a quad-flat type). The lead frame 1' may also be provided with a plurality of leads 3 at each of only two facing sides thereof (in a bi-flat type). A semiconductor chip mounting plate 2 is provided at the central portion of the lead frame 1' inside the leads 3 in such a fashion that it has a chip mounting surface flush with the plane of the leads 3 or a plane slightly set down below the plane of the leads 3. A semiconductor chip 5 is mounted on the chip mounting surface of the semiconductor chip mounting plate 2. The semiconductor chip mounting plate 2 is supported by tie bars 4 extending outwardly from four corners of the semiconductor chip mounting plate 2 to four corresponding corners of the lead frame 1, respectively.

Typically, semiconductor mounting plates are adapted only to mount a semiconductor chip thereon. In association with such a semiconductor mounting plate, a typical package structure is used in which the semiconductor mounting plate is buried in a molded resin seal in such a fashion that it is not exposed to the outside. However, in the case of the package structure of FIGS. 1 and 2 in which the semiconductor mounting plate 2 is packaged while having a great down-set depth, the semiconductor mounting plate 2 may be exposed to the outside at its lower surface so that it also serves as a heat sink. In the latter structure, ground bonding wires 7 are typically bonded to the upper surface of the semiconductor chip mounting plate 2, which has a heat discharge function in addition to its basic function, so that the semiconductor chip mounting plate 2 is grounded.

In such a semiconductor package, namely, the semiconductor package 10' of FIG. 2 using the above mentioned conventional lead frame 1' of FIG. 1 provided with the semiconductor chip mounting plate 1 having a heat discharge function, there is a relatively great difference between the level of the leads 3 and the level of semiconductor chip mounting plate 2. As a result, the bonding wires 7 have an increased length. For this reason, the bonding wires 7 may be short-circuited when an interface peel-off may occur between the semiconductor chip mounting plate 2 and the molded resin seal 6 or when an impact is applied to the semiconductor chip mounting plate 2. In this case, a degradation in the wire bonding quality and reliability occurs. Since the flat surface of the semiconductor chip mounting plate 2 is exposed to the outside in order to obtain a heat discharge effect, moisture may easily penetrate into the package 10' through the interface between the resin seal 6 and semiconductor chip mounting plate 2. In addition, there is a reduction in the coupling strength of the semiconductor chip mounting plate 2 to the resin seal 6. As a result, an interface peel-off phenomenon caused by thermal stress may more easily occur.

SUMMARY OF THE INVENTION

Therefore, a primary object of the invention is to provide a lead frame having a structure capable of inhibiting or reducing an interface peel-off phenomenon occurring between its semiconductor chip mounting plate, adapted to also serve as a heat sink, and a resin seal encapsulating the semiconductor chip mounting plate.

A secondary object of the invention is to provide a lead frame having a structure capable of preventing moisture from penetrating between its semiconductor chip mounting plate and a resin seal encapsulating the semiconductor chip mounting plate or reducing the penetration of moisture.

A third object of the invention is to provide a lead frame having a structure capable of reducing the length of ground bonding wires, thereby effectively reducing the possibility of the bonding wires to be short-circuited.

A fourth object of the invention is to provide a semiconductor package using the lead frame according to one of the primary through third objects of the invention.

The primary and secondary objects of the present invention can be accomplished by providing a lead frame having a semiconductor chip provided at its peripheral portion with at least one groove having a rectangular ring shape.

The third object of the present invention can be accomplished by providing a lead frame having a ground bridge bar arranged between the semiconductor chip mounting plate and the leads while having a rectangular ring shape.

The fourth object of the present invention can be accomplished by providing a semiconductor package fabricated using any one of the lead frames respectively accomplishing the primary through third objects of the present invention.

BRIEF DESCRIPTION OF THE DRAWINGS

Other objects and aspects of the invention will become apparent from the following description of embodiments with reference to the accompanying drawings in which.

DESCRIPTION OF THE PREFERRED EMBODIMENTS

Figure 1:
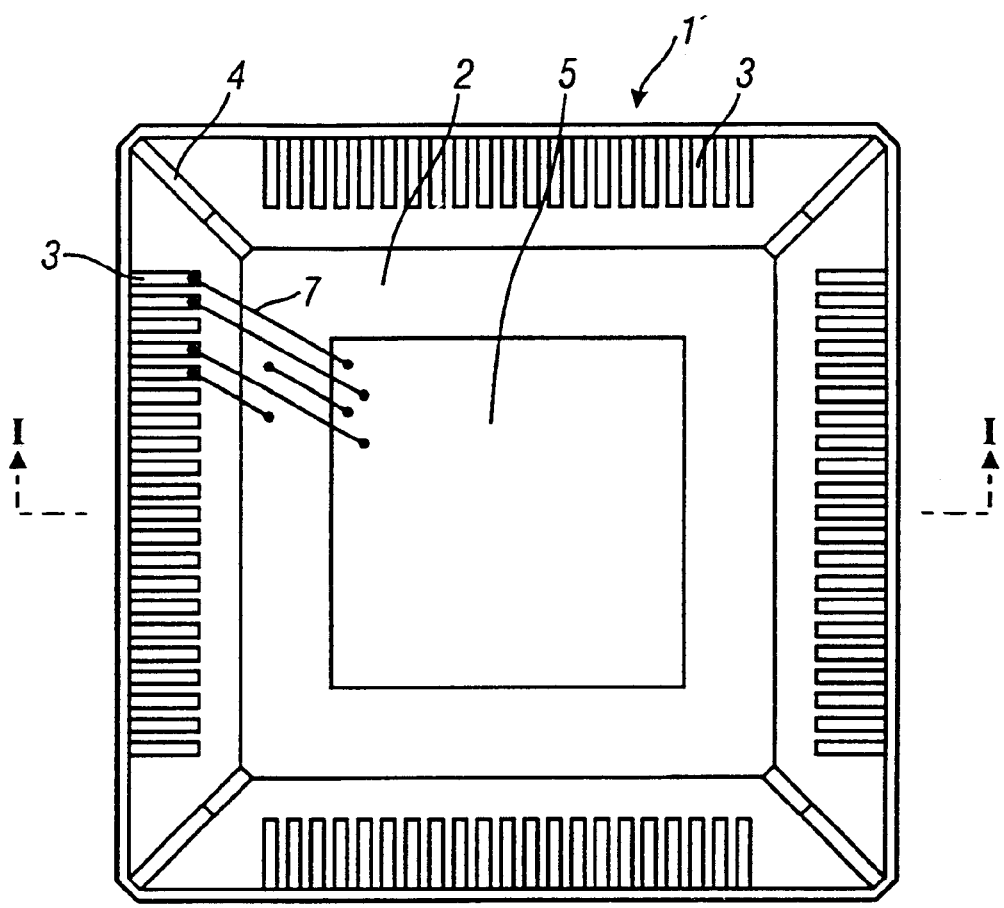
FIG. 1 is a plan view illustrating a semiconductor package fabricated using a conventional lead frame provided with a semiconductor chip mounting plate having a heat discharge function along with a chip mounting function, in a state in which the illustration of a resin seal is omitted.
Figure 2:
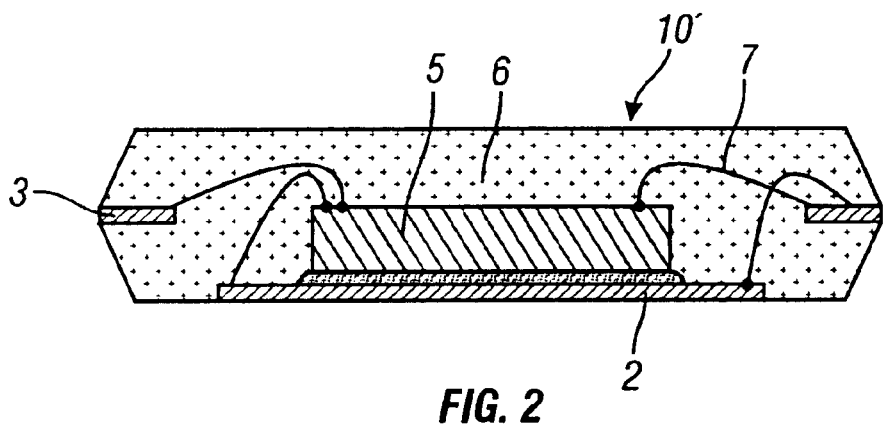
FIG. 2 is a cross-sectional view taken along the line I—I of FIG. 1.
Figure 3:
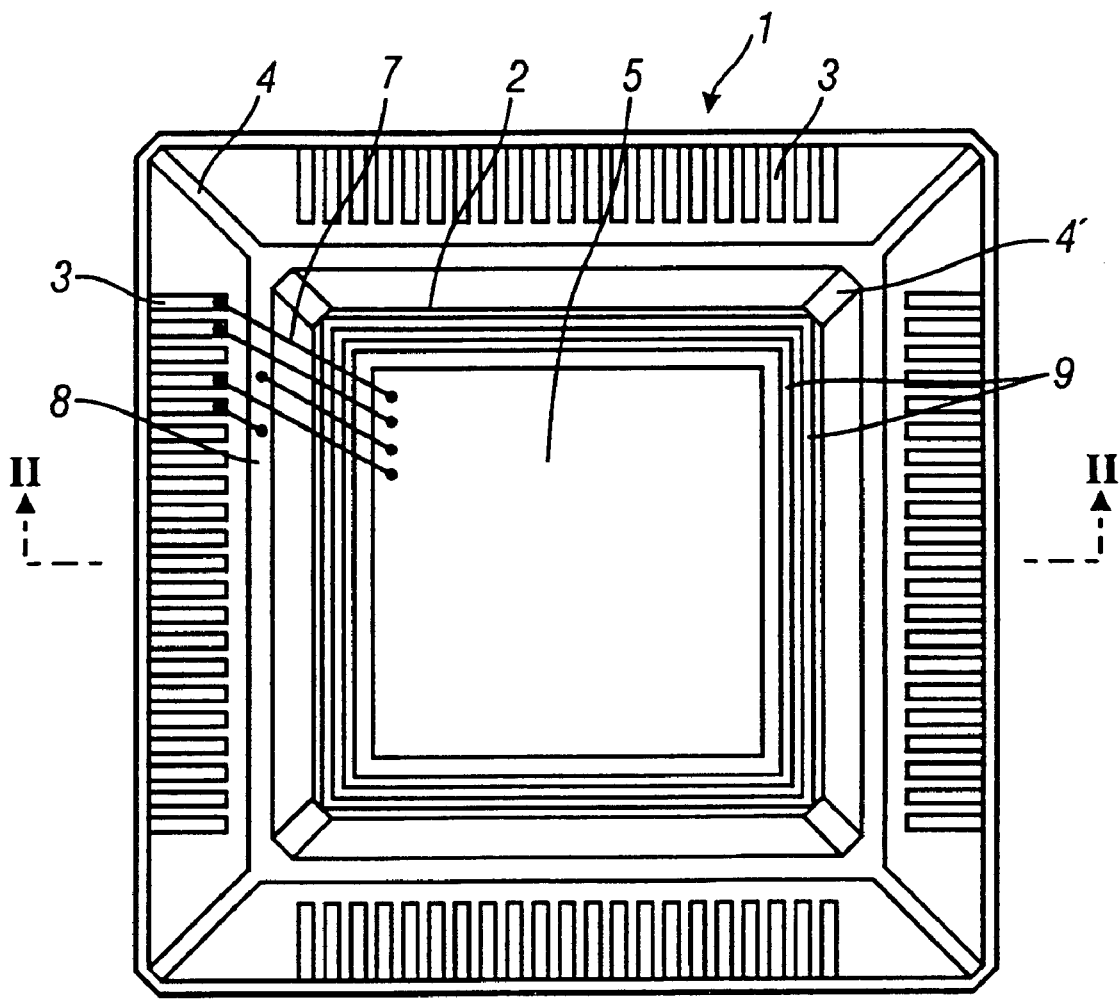
FIG. 3 is a plan view illustrating a semiconductor package fabricated using a lead frame according to a first embodiment of the present invention, in a state in which the illustration of a resin seal is omitted.
Figure 4:
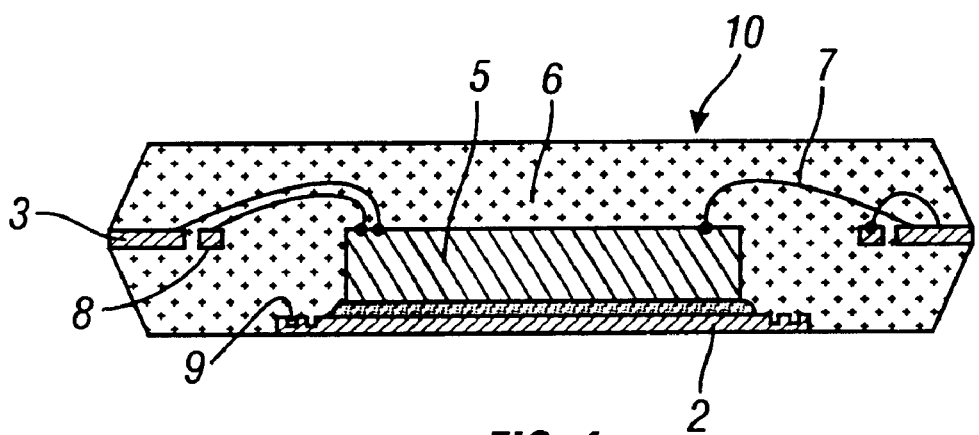
FIG. 4 is a cross-sectional view taken along the line II—II of FIG. 3.

Referring to FIGS. 3 and 4, a lead frame according to a first embodiment of the present invention is illustrated, respectively. As shown in FIGS. 3 and 4, the lead frame, which is denoted by the reference numeral 1 is provided with a plurality of leads 3 extending from each of four sides of the lead frame 1. The lead frame 1 also has a bridge bar 8 positioned on the same plane as the leads 3 and supported by first tie bars 4 extending from four corners of the lead frame 1, respectively. The bridge bar 8 has a rectangular ring shape. The lead frame 1 further has a semiconductor chip mounting plate 2 positioned on a plane not flush with the plane of the leads 3 and supported by second tie bars 4' extending from four corners of the bridge bar 8 in a down-set fashion. The semiconductor chip mounting plate 2 is adapted to mount a semiconductor chip 5 thereon while also serving as a heat sink. At least one peripheral groove 9 is formed at the upper surface of the semiconductor chip mounting plate 2 along the peripheral edge of the semiconductor chip mounting plate 2. In the illustrated case, two peripheral grooves 9 are provided at the semiconductor ship mounting plate 2. The peripheral grooves 9 have a rectangular shape and serve to increase the contact surface of the semiconductor chip mounting plate 2 with a molded resin seal 6 adapted to encapsulate the semiconductor chip mounting plate 2. Accordingly, it is possible to increase the length of a penetration path of moisture defined along the interface between the semiconductor chip mounting plate 2 and the molded resin seal 6, thereby preventing or inhibiting a penetration of moisture into the resultant package denoted by the reference numeral 10 in FIG. 2.

Although the first and second tie bars 4 and 4' are illustrated as being configured to extend from four corners of the associated outer structures, respectively, they are not limited to those configurations. The first and second tie bars 4 and 4' may be configured to extend from sides of the associated outer structures, respectively, as will be described hereinafter. Also, the bridge bar 8 is shown as having a rectangular ring shape. However, the bridge bar 8 may have any appropriate shape, for example, a circular shape. Such configurations are optional in the present invention.

In addition, the leads 3 are illustrated as having a quad type structure in which they extend from and along four sides of the lead frame 1. However, the present invention may also be applied to a binary type structure in which leads extend from and along two facing sides of the lead frame 1.

FIG. 4 is a cross-sectional view taken along the line B—B of FIG. 3. As shown in FIG. 4, the semiconductor chip mounting plate 2, which also serves as a heat sink, is encapsulated in the molded resin seal 6 in such a fashion that it is outwardly exposed at the lower surface of the package 10. Referring to FIG. 4, it can also be found that the ground bridge bar 8, which has a rectangular ring shape and is arranged between the semiconductor chip mounting plate 2 and the leads 3, is positioned on a plane flush with the plane of the leads 3. However, the present invention is not limited to such arrangements. In accordance with another embodiment of the present invention, which will be described hereinafter, the bridge bar 8 may be positioned on a plane not flush with the plane of the leads 3.

In the structure of the lead frame 1 shown in FIGS. 3 and 4 and associated with the first embodiment of the present invention, ground bonding wires 7 can be bonded to the bridge bar 8 flush with the leads 3, rather than the semiconductor chip mounting plate 2 deeply set down to also obtain a heat discharge effect. Accordingly, it is possible to reduce the length of each bonding wire 7. Also, there is no possibility of a short circuit of the ground bonding wires 7 caused by an interface peel-off phenomenon occurring between the semiconductor chip 5 and the mounting plate 2. Thus, an improvement in the bonding efficiency and reliability is achieved.

As mentioned above, at least one rectangular groove 9 is provided at the upper surface of the semiconductor chip mounting plate 2 along the peripheral edge of the semiconductor chip mounting plate 2. Accordingly, the contact surface of the semiconductor chip mounting plate 2 with the molded resin seal 6 in the package 10 increases. By virtue of the increased contact surface, it is possible to increase the coupling strength between the semiconductor chip mounting plate 2 and the molded resin seal 6. It is also possible to increase the length of the penetration path of moisture defined along the interface between the semiconductor chip mounting plate 2 and the molded resin seal 6, thereby preventing or effectively reducing a penetration of moisture into the package 10.

Figure 5:
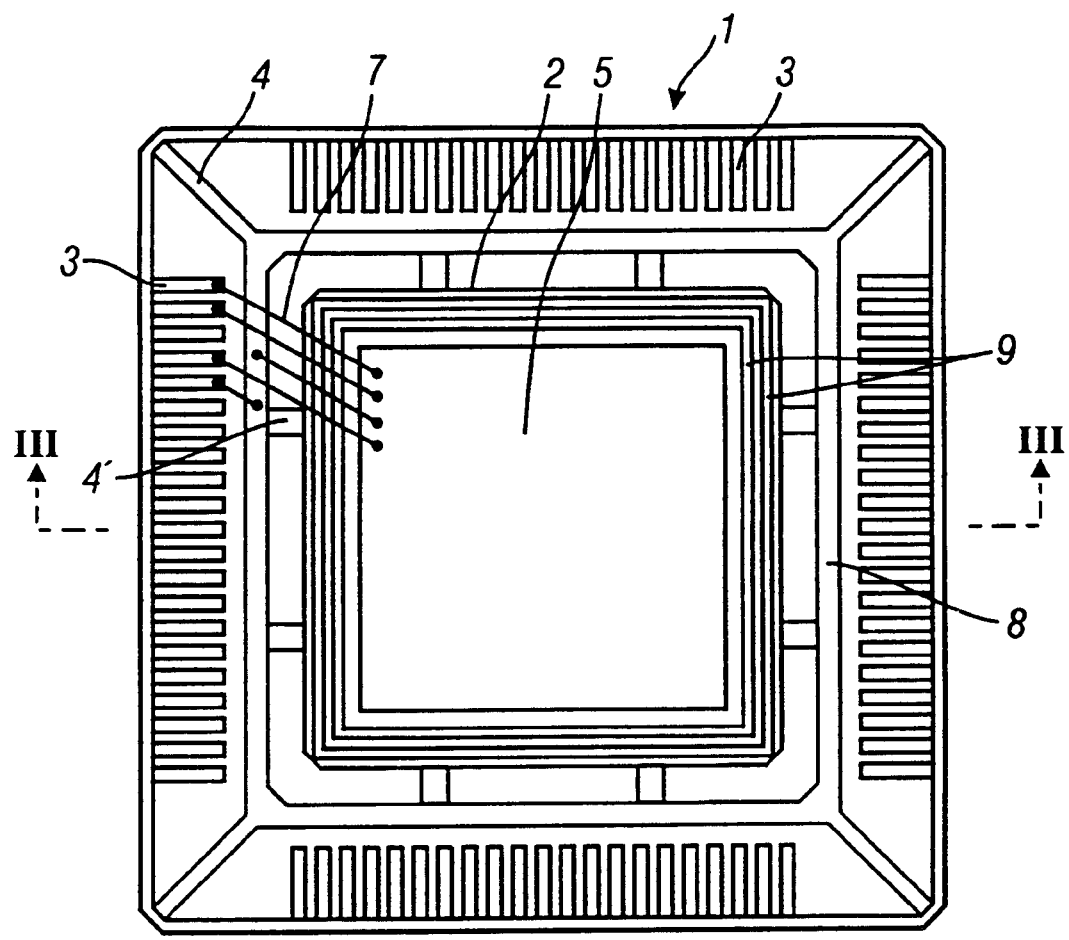
FIG. 5 is a plan view illustrating a semiconductor package fabricated using a lead frame according to a second embodiment of the present invention, in a state in which the illustration of a resin seal is omitted.
Figure 6:
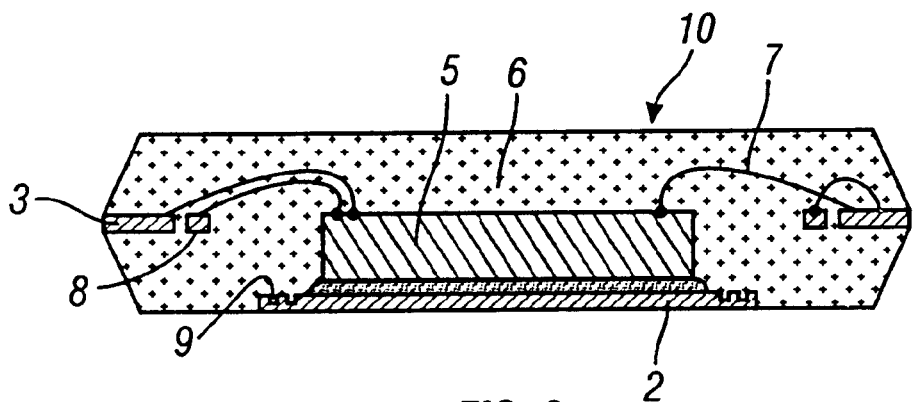
FIG. 6 is a cross-sectional view taken along the line III—III of FIG. 5.

Referring to FIGS. 5 and 6, a lead frame structure according to a second embodiment of the present invention is illustrated, respectively. The lead frame of FIGS. 5 and 6, which is denoted by the same reference numeral as in FIGS. 3 and 4, that is, the reference numeral 1, has the same basic structure as that of the first embodiment. Accordingly, the lead frame of the second embodiment will be described only in conjunction with the difference thereof from that of the first embodiment.

The lead frame 1 of the second embodiment is identical to that of the first embodiment, except for second tie bars 4'. The second tie bars 4' extend from four sides of the bridge bar 8 in a down-set fashion, as in the first embodiment, to support the semiconductor chip. mounting plate 2 by supporting the four sides of the semiconductor chip mounting plate 2, rather than the four corners of the semiconductor chip mounting plate 2.

Although the number of the second tie bars 4' extending from each side of the bridge bar 8 to support an associated one of the four sides of the semiconductor chip mounting plate 2 is two in the illustrated case, it is optionally selected. For instance, one or three second tie bars 4' may be provided for each side of the bridge bar 8.

Figure 7:
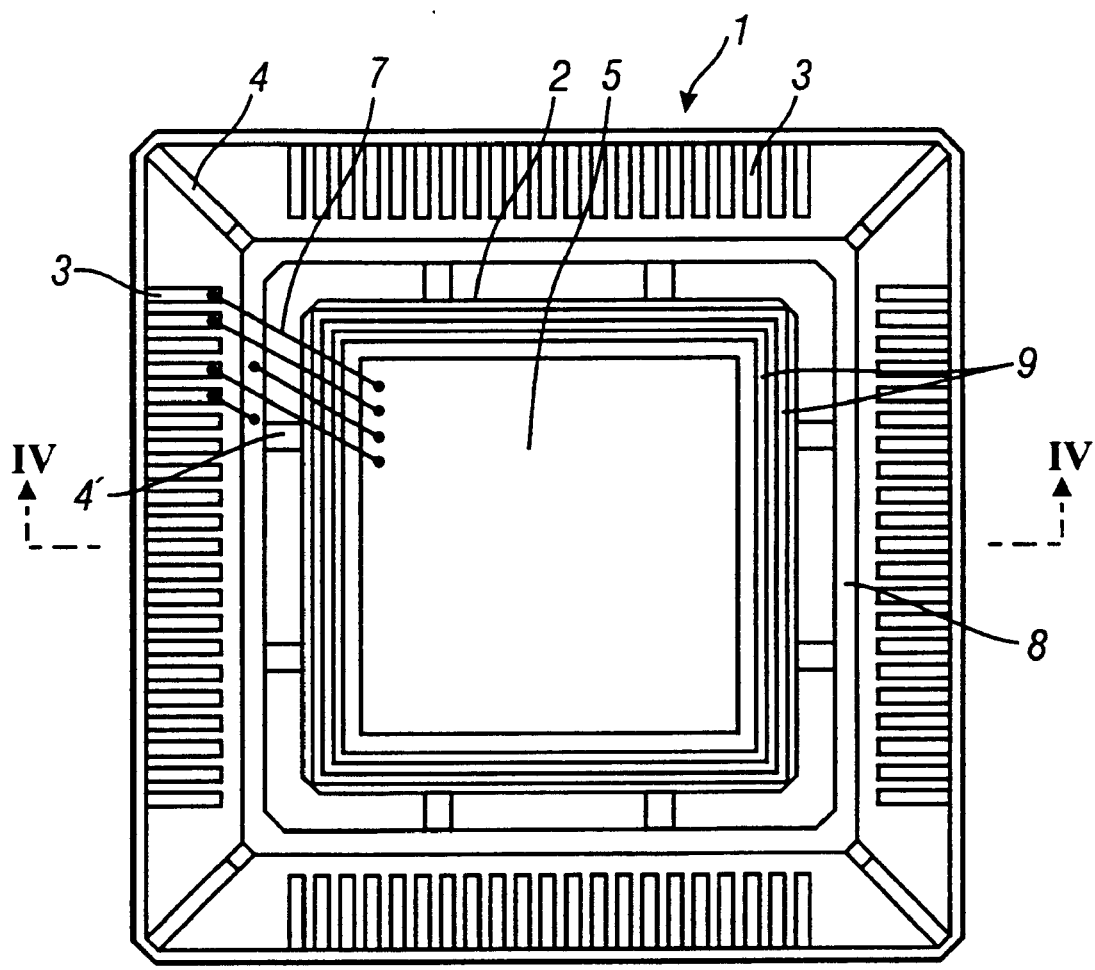
FIG. 7 is a plan view illustrating a semiconductor package fabricated using a lead frame according to a third embodiment of the present invention, in a state in which the illustration of a resin seal is omitted.
Figure 8:
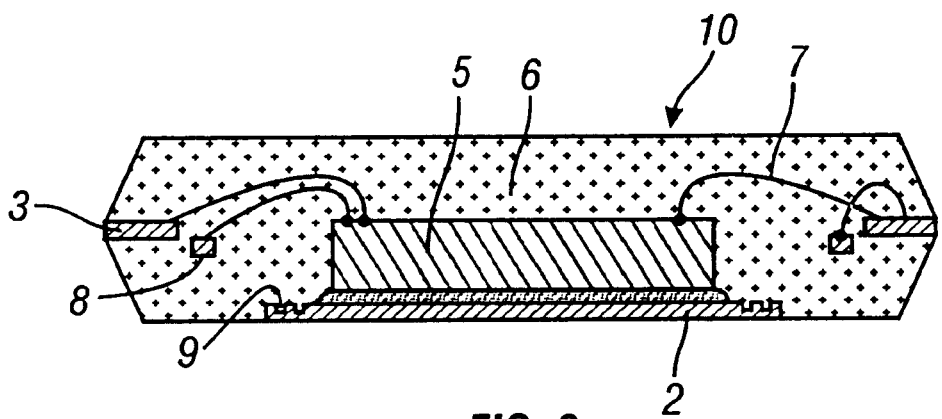
FIG. 8 is a cross-sectional view taken along the line IV—IV of FIG. 7.

Referring to FIGS. 7 and 8, a lead frame structure according to a third embodiment of the present invention is illustrated, respectively. The lead frame of FIGS. 7 and 8, which is denoted by the same reference numeral as in FIGS. 3 and 4, that is, the reference numeral 1, has the same basic structure as that of the second embodiment. Accordingly, the lead frame of the third embodiment will be described only in conjunction with the difference thereof from that of the second embodiment.

In the lead frame 1 of the third embodiment, each first tie bar 4 supporting the bridge bar 8 have a first portion extending from an associated corner of the lead frame 1 in flush with the leads 3 without being set down, and a second portion extending from the first portion to the bridge bar 8 in a down-set fashion. That is, the bridge bar 8 is positioned on a plane not flush with the plane of the leads 3 and the plane of the semiconductor chip mounting plate 2. The remaining configuration of the third embodiment is the same as that of the second embodiment, and no further description thereof will be made.

In the structure of the lead frame 1 according to the second embodiment, it is possible to considerably reduce the possibility of a short circuit or interference between adjacent wires 7 caused by the fact that the bridge bar 8 is flush with the leads 3 as in the first and second embodiments. In accordance with the second embodiment, the first tie bars 4 are slightly set down in order to reduce the down-set depth of the second tie bars 4'. That is, the lead frame 1 of the second embodiment has a structure in which the first and second tie bars 4 and 4' are set down together in a complement fashion. Therefore, it is possible to avoid the second tie bars 4' from being subject to excessive stress in a down-setting process. This results in an advantage in that the flatness of the semiconductor chip mounting plate 2 is easily maintained.

Figure 9:
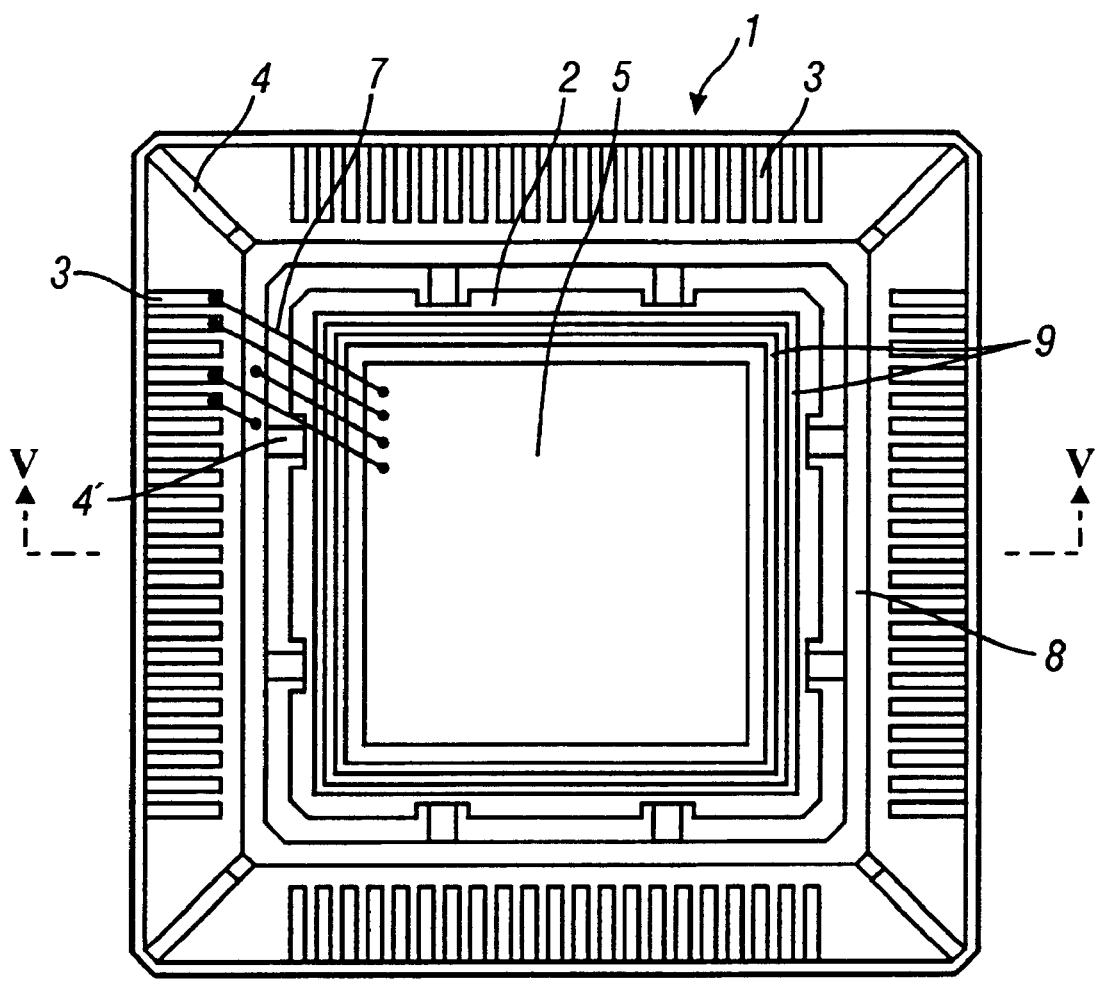
FIG. 9 is a plan view illustrating a semiconductor lo package fabricated using a lead frame according to a fourth embodiment of the present invention, in a state in which the illustration of a resin seal is omitted.
Figure 10:
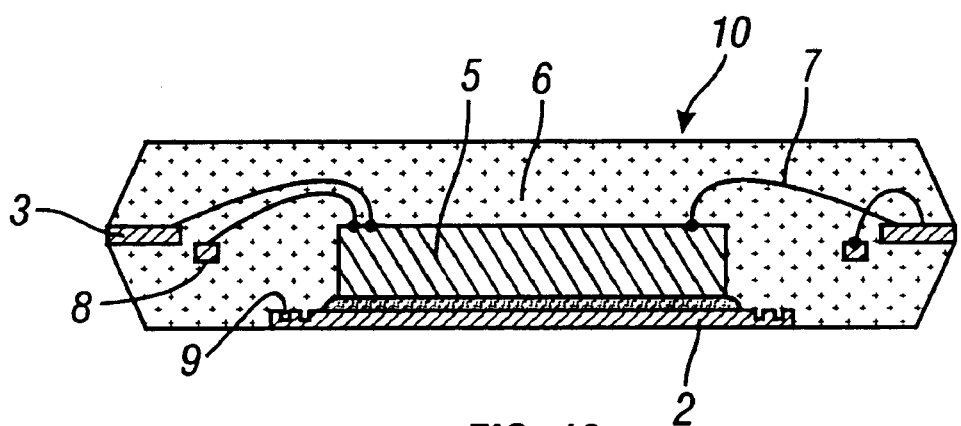
FIG. 10 is a cross-sectional view taken along the line V—V of FIG. 9.

Referring to FIGS. 9 and 10, a lead frame structure according to a fourth embodiment of the present invention is illustrated, respectively. The lead frame of FIGS. 9 and 10, which is denoted by the same reference numeral as in FIGS. 7 and 8, that is, the reference numeral 1, has the same basic structure as that of the third embodiment. Accordingly, the lead frame of the fourth embodiment will be described only in conjunction with the difference thereof from that of the third embodiment.

The lead frame of the fourth embodiment has the same structure as that of the third embodiment, except that the end of each second tie bar 4' opposite to the bridge bar 8, that is, toward the semiconductor chip mounting plate 2, does not extend to the semiconductor chip mounting plate 2, but extends inwardly to a portion of the semiconductor chip mounting plate 2 between an associated edge of the semiconductor chip mounting plate 2 and the peripheral groove 9 beyond the associated edge of the semiconductor chip mounting plate 2 and beneath the semiconductor chip mounting plate 2. In the afore mentioned embodiments, each of the second tie bar 4' is connected to an associated edge of the semiconductor chip mounting plate 2.

Where the lead frame has a structure in which the end of each second tie bar 4' toward the semiconductor chip mounting plate 2 extends inwardly to the portion of the semiconductor chip mounting plate 2 between the associated edge of the semiconductor chip mounting plate 2 and the peripheral groove 9, in place of a structure in which the end of each second tie bar 4' toward the semiconductor chip mounting plate 2 is connected to the associated edge of the semiconductor chip mounting plate 2, each side of the semiconductor chip mounting plate 2 has an increased length by 2, namely, two times the length of the second tie bar 4' extending inwardly from the associated edge of the semiconductor chip mounting plate 2. Accordingly, the semiconductor chip mounting plate 2 has a correspondingly increased area. This results in an improvement in the heat discharge effect of the semiconductor chip mounting plate 2. Where a plurality of peripheral grooves 9 are provided, the inward end of each second tie bar 4' should be positioned outside the outermost one of the peripheral grooves 9.

In accordance with a fifth embodiment of the present invention, a semiconductor package is provided which is fabricated using the lead frame according to any one of the first through fourth embodiments. Basically, the semiconductor package, which is denoted by the reference numeral 10 in the figures, includes a lead frame 1 having a structure according to any one of the first through fourth embodiments. The lead frame 1 has a semiconductor chip mounting plate 2 provided with at least one peripheral groove 9, and a plurality of leads 3. A semiconductor chip is mounted on the semiconductor chip mounting plate 2 of the lead frame 1 inside the peripheral groove 9 and electrically connected to the leads 3. The semiconductor package 10 also includes a resin seal 6 encapsulating the is leads and the semiconductor chip 5, except for the lower surface of the semiconductor chip mounting plate 2.

Any one of the lead frames according to the first through fourth embodiments of the present invention may be used to fabricate the semiconductor package 10 according to the fifth embodiment. This matter is optional in the fifth embodiment of the present invention.

As apparent from the above description, the present invention provides a lead frame having a semiconductor chip mounting plate provided at its peripheral portion with at least one peripheral groove adapted to prevent a penetration of moisture while providing an improved coupling strength. Accordingly, it is possible to prevent or retard a penetration of moisture into the package while increasing the coupling strength between the semiconductor chip mounting plate resin seal. In accordance with the present invention, a ground bridge bar is provided between the semiconductor chip mounting plate and the leads. The ground bridge bar prevents or effectively reduces the possibility of ground bonding wires to be short-circuited. Accordingly, an improvement in the reliability is achieved. Where the lead frame has a structure in which the end of each second tie bar thereof toward the semiconductor chip mounting plate extends inwardly beyond an associated edge of the semiconductor chip mounting plate in accordance with the present invention, the semiconductor chip mounting plate has an increased area. In this case, it is expected to achieve an improvement in the heat discharge effect of the semiconductor chip mounting plate.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A lead frame for a semiconductor package comprising:
a rectangular lead frame body having a central opening;
a plurality of leads arranged at and along each of two or four facing sides of said lead frame body, said leads extending in flush with said lead frame body;
a semiconductor chip mounting plate positioned on a plane not flush with a plane where said leads are positioned, said semiconductor chip mounting plate being supported by down-set tie bars and provided at a surface thereof, on which a semiconductor chip is to be mounted, with at least one groove having a rectangular ring shape; and
a bridge bar arranged between said semiconductor chip mounting plate and said leads and supported by first tie bars, said bridge bar having a rectangular ring shape, wherein said bridge bar is supported by said first tie bars at four corners thereof, respectively, and said semiconductor chip mounting plate is supported by said down-set tie bars at four comers thereof, respectively.

2. A lead frame for a semiconductor package comprising:
a rectangular lead frame body having a central opening;
a plurality of leads arranged at and along each of two or four facing sides of said lead frame body, said leads extending in flush with said lead frame body;
a semiconductor chip mounting plate positioned on a plane not flush with a plane where said leads are positioned, said semiconductor chip mounting plate being supported by down-set tie bars and provided at a surface thereof, on which a semiconductor chip is to be mounted, with at least one groove having a rectangular ring shape; and
a bridge bar arranged between said semiconductor chip mounting plate and said leads and supported by first tie bars, said bridge bar having a rectangular ring shape, wherein said bridge bar is supported by said first tie bars at four corners thereof, respectively, and said semiconductor chip mounting plate is supported by said down-set tie bars at four sides thereof, respectively.

3. The lead frame in accordance with claim 1 or 2, wherein said bridge bar is positioned on a plane flush with said plane of said leads.

4. The lead frame in accordance with claim 1 or 2, wherein said bridge bar is positioned on a plane not flush with said plane of said leads and said plane of said semiconductor chip mounting plate.

5. The lead frame in accordance with claim 1, wherein the semiconductor chip mounting plate includes a plurality of the grooves having the rectangular ring shape, with the grooves being concentric.

6. The lead frame in accordance with claim 2, wherein the semiconductor chip mounting plate includes a plurality of the grooves having the rectangular ring shape, with the grooves being concentric.

7. A lead frame for a semiconductor package comprising:
a rectangular lead frame body having a central opening;
a plurality of leads arranged at and along each of two or four facing sides of said lead frame body, said leads extending in flush with said lead frame body;
a semiconductor chip mounting plate positioned on a plane not flush with a plane where said leads are positioned, said semiconductor chip mounting plate being supported by down-set tie bars and provided at a surface thereof, on which a semiconductor chip is to be mounted, with at least one groove having a rectangular ring shape; and
a bridge bar arranged between said semiconductor chip mounting plate and said leads and supported by first tie bars, said bridge bar having a rectangular ring shape, wherein each of said down-set tie bars, which extends from said bridge bar to support said semiconductor chip mounting plate, extends inwardly to a portion of said semiconductor chip mounting plate between an edge of said semiconductor chip mounting plate and said groove.

8. A semiconductor package comprising:
a lead frame body having a plurality of leads arranged at and along each of two or four facing sides of said lead frame body, and a semiconductor chip mounting plate positioned on a plane not flush with a plane where said leads are positioned, said semiconductor chip mounting plate being supported by down-set tie bars and provided at a surface thereof, on which a semiconductor chip is to be mounted, with at least one groove having a rectangular ring shape, said semiconductor chip mounting plate also serving as a heat sink;
said semiconductor chip mounted on said semiconductor chip mounting plate inside said groove and electrically connected to said leads;
a resin seal encapsulating said leads and said semiconductor chip without encapsulating a lower surface of said semiconductor chip mounting plate; and
a bridge bar arranged between said semiconductor chip mounting plate and said leads and supported by first tie bars, said bridge bar having a rectangular ring shape, wherein each of said down-set tie bars, which extends from said bridge bar to support said semiconductor chip mounting plate, extends inwardly to a portion of said semiconductor chip mounting plate between an edge of said semiconductor chip mounting plate and said groove.

9. A semiconductor package comprising:
a lead frame body having a plurality of leads arranged at and along each of two or four facing sides of said lead frame body, and a semiconductor chip mounting plate positioned on a plane not flush with a plane where said leads are positioned, said semiconductor chip mounting plate being supported by down-set tie bars and provided at a surface thereof, on which a semiconductor chip is to be mounted, with at least one groove having a rectangular ring shape, said semiconductor chip mounting plate also serving as a heat sink;
said semiconductor chip mounted on said semiconductor chip mounting plate inside said groove and electrically connected to said leads;
a resin seal encapsulating said leads and said semiconductor chip without encapsulating a lower surface of said semiconductor chip mounting plate; and
a bridge bar arranged between said semiconductor chip mounting plate and said leads and supported by first tie bars, said bridge bar having a rectangular ring shape, wherein said bridge bar is supported by said first tie bars at four corners thereof, respectively, and said semiconductor chip mounting plate is supported by said down-set tie bars at four corners thereof, respectively.

10. A semiconductor package comprising:
a lead frame body having a plurality of leads arranged at and along each of two or four facing sides of said lead frame body, and a semiconductor chip mounting plate positioned on a plane not flush with a plane where said leads are positioned, said semiconductor chip mounting plate being supported by down-set tie bars and provided at a surface thereof, on which a semiconductor chip is to be mounted, with at least one groove having a rectangular ring shape, said semiconductor chip mounting plate also serving as a heat sink;
said semiconductor chip mounted on said semiconductor chip mounting plate inside said groove and electrically connected to said leads;
a resin seal encapsulating said leads and said semiconductor chip without encapsulating a lower surface of said semiconductor chip mounting plate; and
a bridge bar arranged between said semiconductor chip mounting plate and said leads and supported by first tie bars, said bridge bar having a rectangular ring shape, wherein said bridge bar is supported by said first tie bars at four corners thereof, respectively, and said semiconductor chip mounting plate is supported by said down-set tie bars at four sides thereof, respectively.

11. The semiconductor package in accordance with claim 8, 9, or 10, wherein the semiconductor chip mounting plate includes a plurality of the grooves having the rectangular ring shape, with the grooves being concentric.

12. The semiconductor package in accordance with claim 8, 9, or 10, wherein said bridge bar is positioned on a plane flush with said plane of said leads.

13. The semiconductor package in accordance with claim 8, 9, or 10, wherein said bridge bar is positioned on a plane not flush with said plane of said leads and not flush with said plane of said semiconductor chip mounting plate.

14. The semiconductor package in accordance with claim 8, 9, or 10, wherein the bridge bar is electrically connected to the semiconductor chip.

15. A semiconductor package comprising:
   a leadframe comprising a metal semiconductor chip mounting plate having a first surface, an opposite second surface, and a plurality of metal leads extending toward said semiconductor chip mounting plate, wherein the first surface has at least one groove therein extending in a ring about a peripheral portion of the first surface;
   a semiconductor chip mounted on the fist surface of the semiconductor chip mounting plate inside said groove ring and electrically connected to said leads;
   a bridge bar arranged between said semiconductor chip mounting plate and said leads, said bridge bar fully surrounding said semiconductor chip mounting plate and being integrally connected to the semiconductor chip mounting plate; and
   a resin seal covering said leads, said semiconductor chip, and said first surface of the semiconductor chip mounting plate while exposing the second surface of said semiconductor chip mounting plate.

16. The semiconductor package in accordance with claim 15, wherein the bridge bar is vertically between the leads and the semiconductor chip mounting plate.

17. The semiconductor package in accordance with claim 15, wherein the first surface of the semiconductor chip mounting plate includes a plurality of the grooves, with the grooves being concentric and the semiconductor chip being inside said plurality of the grooves.

18. The semiconductor package in accordance with claim 15, wherein the bridge bar is electrically connected to the chip.

19. The semiconductor package in accordance with claim 18, wherein the bridge bar is electrically connected to at least one of the leads.

20. The semiconductor package in accordance with claim 6, wherein the bridge bar is electrically connected to at least one of the leads.

21. The semiconductor package in accordance with claim 20, wherein the bridge bar is vertically between the leads and the semiconductor chip mounting plate.

22. The lead frame in accordance with claim 20, wherein said bridge bar is positioned on a plane flush with a plane of said leads.

23. A semiconductor package comprising:
   a leadframe comprising a metal semiconductor chip mounting plate having a first surface, an opposite second surface, and a plurality of metal leads extending toward said semiconductor chip mounting plate;
   a semiconductor chip mounted on the first surface of the semiconductor chip mounting plate and electrically connected to said leads;
   a bridge bar arranged between said semiconductor chip mounting plate and said leads, said bridge bar filly surrounding said semiconductor chip mounting plate and being integrally connected to the semiconductor chip mounting plate; and
   a resin seal covering said leads, said semiconductor chip, and said first surface of the semiconductor chip mounting plate while exposing the second surface of said semiconductor chip mounting plate.

24. The semiconductor package in accordance with claim 23, wherein the bridge bar is electrically connected to the chip.

25. The semiconductor package in accordance with claim 24, wherein the bridge bar is electrically connected to at least one of the leads.

26. The semiconductor package in accordance with claim 23, wherein the bridge bar is electrically connected to at least one of the leads.

27. The semiconductor package in accordance with claim 23, wherein the bridge bar is vertically between the leads and the semiconductor chip mounting plate, and is electrically connected to at least one of the leads.

28. The lead frame in accordance with claim 23, wherein said bridge bar is positioned on a plane flush with a plane of said leads, and is electrically connected to at least one of the leads.

* * * * *

UNITED STATES PATENT AND TRADEMARK OFFICE
CERTIFICATE OF CORRECTION

PATENT NO.     : 6,437,427 B1
DATED          : August 20, 2002
INVENTOR(S)    : Choi It is certified that error appears in the above-identified patent and that said Letters Patent is hereby corrected as shown below:

Column 6,
Line 66, delete "comers" and insert -- corners --.

Column 8,
Line 38, delete "comers" and insert -- corners --.

Column 9,
Line 23, delete "fist" and insert -- first --.

Signed and Sealed this

Twenty-fifth Day of March, 2003

JAMES E. ROGAN
*Director of the United States Patent and Trademark Office*